United States Patent
Lv et al.

(10) Patent No.: US 11,746,963 B1
(45) Date of Patent: Sep. 5, 2023

(54) BACKLIGHT MODULE AND DISPLAY DEVICE

(71) Applicant: HKC CORPORATION LIMITED, Shenzhen (CN)

(72) Inventors: Jie Lv, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/067,323

(22) Filed: Dec. 16, 2022

(30) Foreign Application Priority Data

Apr. 20, 2022 (CN) .......................... 202210418023.9

(51) Int. Cl.
  *F21K 9/20* (2016.01)
  *F21Y 105/16* (2016.01)
  *H05K 7/14* (2006.01)

(52) U.S. Cl.
  CPC .............. *F21K 9/20* (2016.08); *H05K 7/14* (2013.01); *F21Y 2105/16* (2016.08)

(58) Field of Classification Search
  CPC .... G02B 6/009; G02B 6/0078; G02B 6/0068; F21K 9/20; F21Y 105/16
  See application file for complete search history.

(56) References Cited

U.S. PATENT DOCUMENTS

| 2016/0299286 A1* | 10/2016 | Choi .................... G02B 6/0068 |
| 2018/0306395 A1* | 10/2018 | Conrad .................... F21K 9/232 |
| 2020/0225903 A1* | 7/2020 | Cohen ...................... G09G 5/12 |

FOREIGN PATENT DOCUMENTS

| CN | 205487197 | 8/2016 |
| CN | 207216220 | 4/2018 |
| CN | 211016336 | 7/2020 |
| CN | 212781597 | 3/2021 |
| CN | 215264307 | 12/2021 |
| CN | 114187832 | 3/2022 |
| WO | 2022036904 | 2/2022 |

OTHER PUBLICATIONS

CNIPA, Office Action for CN Application No. 202210418023.9, dated Mar. 10, 2023.

* cited by examiner

*Primary Examiner* — William J Carter
(74) *Attorney, Agent, or Firm* — Hodgson Russ LLP

(57) ABSTRACT

A backlight module includes a back plate, at least two lamp plates, a diffuser plate and a plurality of layers of optical film provided in a form of a stack. The at least two lamp plates are disposed on one side of the back plate. The diffuser plate is disposed on one side of the lamp plate away from the back plate. The plurality of layers of optical film are disposed on one side of the diffuser plate away from the lamp plate. The backlight module further includes at least two magnetic attraction parts which are disposed on a back side of the lamp plate, and are attracted to a lamp-plate mounting side of the back plate.

15 Claims, 3 Drawing Sheets

BACKLIGHT MODULE AND DISPLAY DEVICE

CROSS-REFERENCE TO RELATED APPLICATION

This application claims priority to Chinese Patent Application No. 202210418023.9, filed Apr. 20, 2022, the entire disclosure of which is incorporated herein by reference.

FIELD OF TECHNOLOGY

The present application relates to the technical field of display, in particular to a backlight module and a display device.

BACKGROUND

Compared with the traditional LCD (Liquid Crystal Display) display with LED (Light Emitting Diode) backlight, the LCD display with Mini-LED backlight has better performance in dynamic contrast, brightness, color gamut and viewing angle, and has the advantages of light weight, high image quality, low power consumption and energy saving.

Limited by the existing manufacturing technology of Mini-LED lamp plate, generally only small size Mini-LED lamp plate can be manufactured. Challenges arise when manufacturing large size Mini-LED TV. If care is not taken, displaying effects such as brightness and viewing angle may be adversely affected. It would therefore be desirable to provide a display device with improved Mini-LED lamp plate.

SUMMARY

There are provided a backlight module and a display device according to embodiments of the present disclosure. The technical solution is as below:

According to a first aspect of the present application, there is provided a backlight module including, a back plate, at least two lamp plates disposed on a side of the back plate, a diffuser plate disposed on a side of the lamp plate away from the back plate and a plurality of layers of optical film disposed on a side of the diffuser plate away from the lamp plate. The backlight module further includes: at least two magnetic attraction parts disposed on a back side of the lamp plate, and the at least two magnetic attraction parts being attracted to a lamp-plate mounting side of the back plate. The back plate, at least two lamp plates, the diffuser plate and the plurality of layers of optical film are arranged in a form of stack.

According to a second aspect of the present application, there is provided a display device. The display device includes the backlight module of any one described above and a display panel. The backlight module is configured for providing a backlight for the display panel.

BRIEF DESCRIPTION OF THE DRAWINGS

In order to more clearly illustrate the technical solutions in embodiments of the present application or the prior art, the following will briefly introduce the drawings that are desired to be used in the description of the embodiments. Obviously, the drawings in the following description are merely some embodiments of the present application, from which other drawings may be obtained without exerting inventive effort by those ordinarily skilled in the art.

DETAILED DESCRIPTION OF THE EMBODIMENTS

Figure 1:
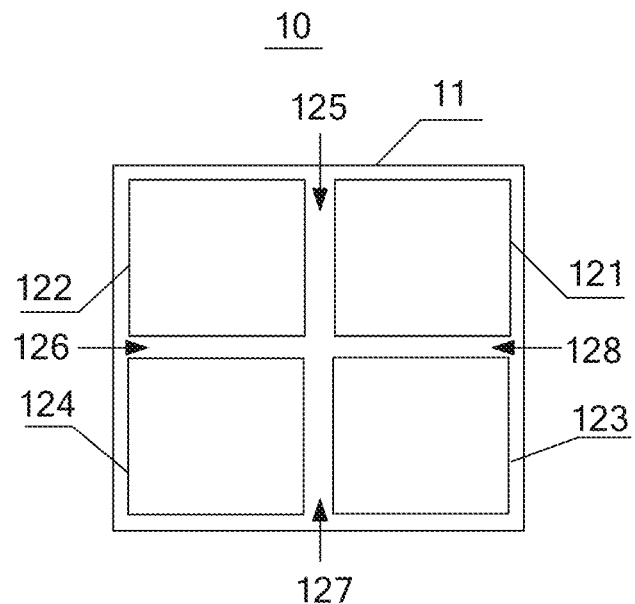
FIG. 1 is a structural diagram of a backlight module provided by a first embodiment of the present application.

The present application is described in further following detailed below in conjunction with the accompanying drawings and embodiments. In particular, the following embodiments are only used to illustrate the present application, but do not limit the scope of the present application. Similarly, the following embodiments are only some but not all of the embodiments of the present application, and all other embodiments obtained by those of ordinary skill in the art without creative labor fall within the scope of protection of the present application.

It should be noted that the terms "first", "second" and the like (if any) in the description and claims as well as the above drawings of the present invention are used to distinguish similar objects and are not necessarily used to describe a specific order or sequence. It should be understood that the data thus used may be interchanged under appropriate circumstances, so that the embodiments of the present application described herein, for example, can be implemented in an order other than those illustrated or described herein. In addition, the terms "including" and "having" and any variations of them, intended to cover non-exclusive inclusions, for example, processes, methods, systems, products, or devices including a series of steps or units need not be limited to those clearly listed, but may include other steps or units that are not clearly listed or inherent to such processes, methods, products, or devices.

First Embodiment

The present application discloses a backlight module. The backlight module includes a back plate, at least two lamp plates, a diffuser plate and a plurality of layers of optical film provided in a form of a stack. The at least two lamp plates are disposed on one side of the back plate. The diffuser plate is disposed on one side of the lamp plate away from the back plate. The plurality of layers of optical film are disposed on one side of the diffuser plate away from the lamp plate. The backlight module further includes at least two magnetic attraction parts. The magnetic attraction parts are disposed on one side of the lamp plate, and the lamp plate is magnetically attracted on one side of the back plate through the magnetic attraction parts.

The back plate is provided with a lamp-plate mounting side and a back side. The lamp-plate mounting side is used for mounting the lamp plate, and the back side of the back plate and the lamp-plate mounting side of the back plate are two opposite sides of the back plate. At least two lamp plates are disposed on the lamp-plate mounting side of the back plate, thereby forming a light source of the backlight module. The light emitted by the lamp plate is irradiated to the diffuser plate, to be optically diffused by the diffuser plate, making the light emitted by the lamp plate form a uniform area source. Light source passing through the diffuser plate is irradiated to the light guide plate, which is used to guide a direction of light scattering and used to improve the brightness of the light finally emitted from the backlight module and ensure the brightness of the light emitted from the backlight module.

The lamp plate is disposed on the back side of the back plate, the back side of the lamp plate is opposite to the light-emitting side of the lamp plate, and the light-emitting side of the lamp plate is provided with lamp beads to provide light sources. The shapes and specifications of the lamp plates can be the same, for example, the lamp plates can all be arranged in rectangular shapes with equal sizes, thus achieving a regular arrangement of light plates. The magnetic part is a magnetic member, such as a magnet, and the magnetic adsorption of the magnetic attraction part allows the lamp plate to be adsorbed on the back plate to be fixed.

Figure 2:
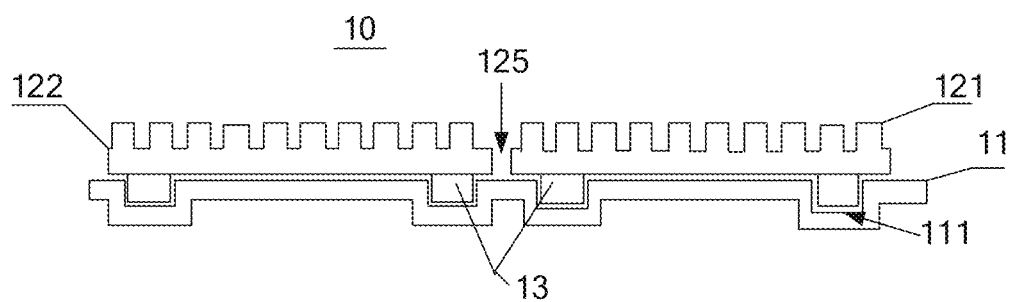
FIG. 2 is a side view of the backlight module of FIG. 1.

Referring specifically to FIG. 1 as well as FIG. 2, FIG. 1 is a structural diagram of a backlight module 10 provided by a first embodiment of the present application, and FIG. 2 is a side view of the backlight module 10 of FIG. 1.

In some specific embodiments, the number of lamp plates is four, namely, a first lamp plate 121, a second lamp plate 122, a third lamp plate 123 and a fourth lamp plate 124. The first lamp plate 121, the second lamp plate 122, the third lamp plate 123, and the fourth lamp plate 124 are all arranged in a rectangular shape and have the same size. The first lamp plate 121, the second lamp plate 122, the third lamp plate 123, and the fourth lamp plate 124 are respectively provided in four corner areas of the back plate 11. Alternatively, in other embodiments, the number of lamp plates may not be limited to four, and the shape of the lamp plates may not be limited to rectangles. For example, the shape of the lamp plate may be other regular polygons or the like.

The first lamp plate 121, the second lamp plate 122, the third lamp plate 123, and the fourth lamp plate 124 are all fixed to the back plate 11 by the magnetic attraction part 13. It should be understood that only the magnetic attraction parts 13 corresponding to the first lamp plate 121 and the second lamp plate 122 are shown in FIG. 2.

In this way, on the one hand, the detachable arrangement of each lamp plate is achieved. On the other hand, when the lamp plate is expanded by heat, different lamp plates fixed on the back plate by magnetic attraction can be moved, thereby preventing the lamp plate from being crushed and deformed. Further, two adjacent lamp plates are arranged in one group. In at least one group of lamp plates, the magnetic attraction part 13 of a first lamp plate has a first pole, a second lamp plate has a second pole with a polarity opposite to a polarity of the first pole so that the first lamp plate and the second lamp plate are attracted to each other by the first pole and the second pole.

Due to the appearance dimension tolerance and assembly tolerance between adjacent lamp plates, there are inevitable hidden joints between the lamp plates, which often affects the backlight display effect. With this arrangement, adjacent lamp plates attract each other through the first pole and the second pole with opposite polarities in the magnetic attraction part, so that the lamp plates attract each other, making the lamp plates close to each other, which can reduce the gap when the lamp plates are spliced and improve the display effect.

It should be understood that the magnetic attraction part 13 of the first lamp plate of at least one set of lamp plates is attracted to each other by the first pole and the second pole of the second lamp plate, thereby bringing the first lamp plate and the second lamp plate close by mutual attraction. The first pole may be one of the N pole and the S pole, and the second pole may be the other of the N pole and the S pole so that the opposite poles are attracted.

Referring to FIGS. 1 and 2, in some specific embodiments, two lamp plates disposed on the upper side of the back plate 11 are used as the first lamp plate 121 and the second lamp plate 122. The magnetic attraction part 13 of the first lamp plate 121 has a first pole, and the second lamp plate 122 has a second pole with a polarity opposite to the polarity of the first pole. The first lamp plate 121 and the second lamp plate 122 approach each other by mutual attraction.

It is to be understood that the two adjacent lamp plates are two lamp plates spliced to each other with a joint between the two adjacent lamp plates. Referring to FIGS. 1 and 2, the two adjacent lamp plates may be the first lamp plate 121 and the second lamp plate 122, the first lamp plate 121 and the third lamp plate 123, the second lamp plate 122 and the fourth lamp plate 124, and the fourth lamp plate 124 and the third lamp plate 123. There is a first joint 125 between the first lamp plate 121 and the second lamp plate 122, a second joint 126 between the second lamp plate 122 and the fourth lamp plate 124, a third joint 127 between the third lamp plate 123 and the fourth lamp plate 124, and a fourth joint 128 between the third lamp plate 123 and the first lamp plate 121.

Thus, FIG. 1 as well as FIG. 2 show only exemplarily the positional relationship between the first lamp plate 121 and the second lamp plate 122 in a group of lamp plates. Referring to FIG. 1, in other embodiments, when the second lamp plate 122 and the fourth lamp plate 124 are a group of lamp plates, the second lamp plate 122 may be the first lamp plate in the group of lamp plates, and the third lamp plate 123 may be the second lamp plate in the group of lamp plates.

Alternatively, in some embodiments, the magnetic attraction part 13 of the first lamp plate has a first pole, and the magnetic attraction part 13 of the second lamp plate has a second pole in at least two groups of lamp plates.

For example, referring to FIG. 1, the first lamp plate 121 and the second lamp plate 122 are a group of lamp plates, and the second lamp plate 122 and the fourth lamp plate 124 may also be a group of lamp plates. At this time, the magnetic attraction part 13 of the first lamp plate 121 has the first pole, the magnetic attraction part 13 of the second lamp plate 122 has the second pole, and the magnetic attraction part 13 of the fourth lamp plate 124 has the first pole. For example, the first lamp plate 121 and the second lamp plate 122 are a group of lamp plates, the second lamp plate 122 and the fourth lamp plate 124 may be a group of lamp plates, the third lamp plate 123 and the fourth lamp plate 124 are a group of lamp plates, and the third lamp plate 123 and the first lamp plate 121 are a group of lamp plates. In this case, the magnetic attraction part 13 of the first lamp plate 121 has the first pole, the magnetic attraction part 13 of the second lamp plate 122 has the second pole, the magnetic attraction part 13 of the fourth lamp plate 124 has the first pole, and the magnetic attraction part 13 of the third lamp plate 12 has the second pole.

Second Embodiment

Figure 3:
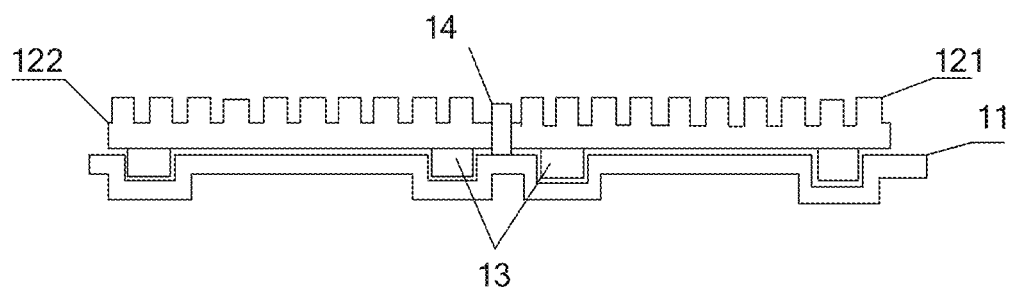
FIG. 3 is a structural diagram of a backlight module provided by a second embodiment of the present application.

Referring to FIG. 3, FIG. 3 is a structural diagram of a backlight module 10 provided by a second embodiment of the present application. The backlight module provided in the second embodiment is based on the first embodiment, please refer to the first embodiment for the related contents.

Specifically, in the above-described group in which opposite poles are provided, the first lamp plate 121 and the second lamp plate 122 are provided with reflective paste 14 at an interval position, and the reflective paste 14 protrudes from an upper surface of the lamp plate. The upper surface of the lamp plate is the surface away from the back plate and provided with lamp beads. In connection with the above embodiment, the reflective paste 14 is provided at the first joint 125, and the reflective paste 14 protrudes from the upper surfaces of the first lamp plate 121 and the second lamp plate 122.

More specifically, the reflective paste 14 is a flexible white reflective paste. After forming a raised part of the reflective paste 14, the raised part is located at the position of the previous first joint 125, and the raised part can reflect the light generated by the lamp plate, so that the joint 125 is no longer a hidden joint, and the display of the display screen is uniform, thereby improving the display quality. Alternatively, in other embodiments, the reflective paste 14 may only be filled at the interval position between the first lamp plate 121 and the second lamp plate 122, and does not protrude from the upper surface of the lamp plate. This embodiment can also make the joint no longer a hidden joint, thereby improving the display quality.

It should be understood that, when the reflective paste 14 is provided, the reflective paste 14 is only provided in the first joint 125 in the beginning, and the reflective paste 14 does not protrude from the upper surfaces of the first lamp plate 121 and the second lamp plate 122. Then, the first lamp plate 121 and the second lamp plate 122 squeeze the reflective paste 14 so that the reflective paste is raised relative to the upper surfaces of the first lamp plate 121 and the second lamp plate 122 through mutual attraction.

It should be understood that in the specific arrangement of the reflective paste 14, the first lamp plate 121 and the second lamp plate 122 may be arranged at a preset position, at which time the first joint 125 is formed between the first lamp plate 121 and the second lamp plate 122, and the reflective paste 14 may be further disposed at the first joint 125. In some embodiments, the reflective paste 14 is disposed in the first joint 125 within a preset time after the first lamp plate 121 and the second lamp plate 122 are disposed to the preset position, so that the reflective paste 14 is deformed before the first lamp plate 121 and the second lamp plate 122 reach the final position under the effect of magnetic force.

In some embodiments, the magnetic attraction parts have the first pole and the second pole. In the group of lamp plates provided with opposite poles, the first pole of the magnetic attraction parts on the first lamp plate and the second pole of the magnetic attraction parts on the second lamp plate are arranged adjacent to each other in an arrangement direction of the first lamp plate and the second lamp plate. For example, when the first lamp plate and the second lamp plate are arranged in a longitudinal direction of the back plate, the first pole of the magnetic attraction part on the first lamp plate and the second pole on the second lamp plate are arranged adjacent to each other in the longitudinal direction of the back plate.

In some embodiments, the magnetic attraction part 13 disposed on a side of the first lamp plate 121 adjacent to the second lamp plate 122 is provided with the first pole, and the magnetic attraction part 13 disposed on a side of the second lamp plate 122 adjacent to the first lamp plate 121 is provided with the second pole, the first pole is disposed opposite to the second pole one-to-one.

Figure 4:
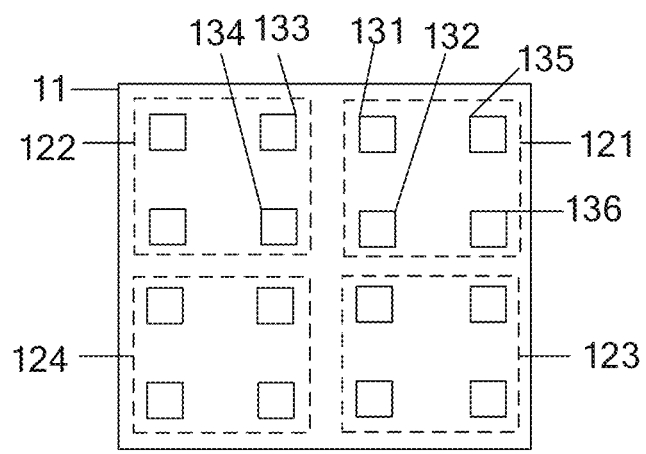
FIG. 4 is a diagram of arrangement of a magnetic attraction part in the backlight module in FIG. 1.

With reference to FIG. 4, FIG. 4 is a diagram of arrangement of a magnetic attraction part 13 in the backlight module 10 in FIG. 1.

A first sub-magnetic attraction part 131 and a second sub-magnetic attraction part 132 are provided on a side of the first lamp plate 121 adjacent to the second lamp plate 122, and a third sub-magnetic attraction part 133 and a fourth sub-magnetic attraction part 134 are provided on a side of the second lamp plate 122 adjacent to the first lamp plate 121. The first sub-magnetic attraction part 131 has the first pole, the third sub-magnetic attraction part 133 has the second pole, and the first sub-magnetic attraction part 131 is disposed opposite to the third sub-magnetic attraction part 133, thereby achieving mutual attraction between the first sub-magnetic attraction part 131 and the third sub-magnetic attraction part 133. The second sub-magnetic attraction part 132 has the first pole, the fourth sub-magnetic attraction part 134 has the second pole, and the second sub-magnetic attraction part 132 is disposed opposite to the fourth sub-magnetic attraction part 134, thereby achieving mutual attraction between the second sub-magnetic attraction part 132 and the fourth sub-magnetic attraction part 134.

It should be understood that the above embodiments only show the mutual attraction between the first lamp plate 121 and the second lamp plate 122 by two pairs of magnetic attraction parts 13, and in other embodiments, attraction between the first lamp plate 121 and the second lamp plate 122 may be carried out by more than two pairs of magnetic attraction parts. The adjacent magnetic attraction parts attract each other, which can achieve better attraction effect.

Figure 5:
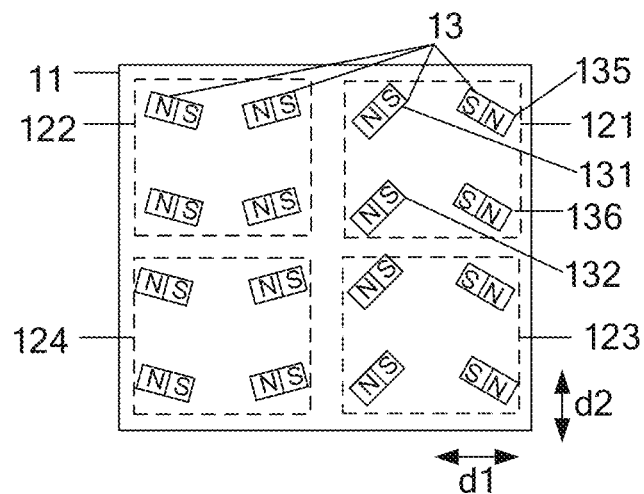
FIG. 5 is a diagram of another arrangement of the magnetic attraction part in the backlight module in FIG. 1.

Referring to FIG. 5, FIG. 5 is a diagram of another arrangement of the magnetic attraction part 13 in the backlight module 10 in FIG. 1.

Specifically, the first pole and the second pole of the magnetic attraction part 13 are arranged in a direction parallel to a plane of the lamp plate. In the group of lamp plates provided with opposite poles, an arrangement direction of the first pole and the second pole of the magnetic attraction parts 13 on the first lamp plate intersects an arrangement direction of the first pole and the second pole of the magnetic attraction parts 13 on the second lamp plate.

The arrangement direction of the first pole and the second pole of the magnetic attraction part on the first lamp plate intersects the arrangement direction of the first pole and the second pole of the magnetic attraction part 13 on the second lamp plate, namely, there is an included angle between length extension directions of the oppositely arranged magnetic attraction parts 13 in the first and second lamp plates.

It should be understood that the first pole and the second pole of the magnetic attraction part 13 are arranged in a direction parallel to the plane of the lamp plate, that is, the longitudinal direction of the magnetic attraction part 13 is parallel to the direction of the first lamp plate 121 and the second lamp plate 122, at which time the magnetic attraction part 13 is arranged parallel to the lamp plate. In other embodiments, the magnetic attraction 13 may also be disposed perpendicular to the plane of the lamp plate. As can be seen from the above embodiments, the magnetic attraction part 13 is provided on the lamp plate, and in other embodiments, the magnetic attraction part 13 may be provided on the back plate 11.

Referring to FIG. 5, the magnetic attraction part 13 corresponding to the first lamp plate 121 is provided with a first pole N, and the magnetic attraction part corresponding to the second lamp plate 122 is provided with a second pole S, and the first pole N is opposite to the second pole S so that the first pole N and the second pole S attract each other. There is an included angle between the length direction of the magnetic attraction part 13 of the first lamp plate 121 and the length direction of the magnetic attraction part 13 of the second lamp plate 122, so that the arrangement direction of the first pole and the second pole of the magnetic attraction part 13 on the first lamp plate 121 intersect the arrangement direction of the first pole and the second pole of the magnetic attraction part 13 on the second lamp plate 122. The included angle is greater than 0 degrees and less than 90 degrees. It should be understood that there is an included angle between the first pole N and the second pole S, and the mutual attraction between the first pole N and the second pole S can be enhanced by setting the included angle.

Further, a plurality of lamp plates are provided and arranged in arrays in a row direction and a column direction, and two adjacent lamp plates in the row direction forming the group. Like poles of the magnetic attraction parts of the two adjacent lamp plates in the column direction are opposite to each other in the column direction; and opposite poles of the magnetic attraction parts of the two adjacent lamp plates in the column direction are opposite to each other in the column direction.

Referring specifically to FIG. 4 and FIG. 5, in some specific embodiments, each lamp plate is provided with four magnetic attraction parts 13, and the four magnetic attraction parts 13 are arranged in two columns in the row direction, and the row direction may be the length direction of the lamp plate. The magnetic attraction parts are arranged in two rows in the column direction of the lamp plates, and the column direction can be a width direction of the lamp plates, so as to achieve the array arrangement of the lamp plates in the row direction and the column direction.

As shown in FIG. 4, the first lamp plate 121 is provided with a first sub-magnetic attraction part 131, a second sub-magnetic attraction part 132, a fifth sub-magnetic attraction part 135, and a sixth sub-magnetic attraction part 136. The first sub-magnetic attraction part 131 and the fifth sub-magnetic attraction part 135 are arranged in one row, the second sub-magnetic attraction part 132 and the sixth sub-magnetic attraction part 136 are arranged in one row, and the two rows are arranged in the width direction of the first lamp plate 121. The first sub-magnetic attraction part 131 and the second sub-magnetic attraction part 132 are arranged in one row, and the fifth sub-magnetic attraction part 135 and the sixth sub-magnetic attraction part 136 are arranged in one row, and both rows are arranged in the longitudinal direction of the first lamp plate 121.

Referring to FIG. 5, the poles with the same polarity of the magnetic attraction parts of two adjacent lamp plates in the column direction, e.g., the second lamp plate 122 and the fourth lamp plate 124 are arranged opposite to each other in the column direction. Alternatively, the poles with different polarities of the magnetic attraction parts of the two adjacent lamp plates in the column direction, e.g., the first lamp plate 121 and the third lamp plate 123, are arranged opposite each other in the column direction.

In other embodiments, the two magnetic attraction parts 13 located in the same column in the same lamp plate may be arranged in parallel, such as the arrangement of the first lamp plate 121 and the third lamp plate 123, and the arrangement of the second lamp plate 122 and the fourth lamp plate 124 in FIG. 5.

Further, the magnetic attraction parts arranged in the width direction of different lamp plates are also arranged in parallel with each other, and the width direction of the lamp plate is the row arrangement direction of the magnetic attraction parts as described above. For example, in FIG. 5, the magnetic attraction parts 13 of the second lamp plate 122 and the fourth lamp plate 124 in the width direction of the second lamp plate 122 and the fourth lamp plate 124 are arranged in the width direction.

With reference to FIG. 5, in some specific embodiments, the back plate 11 has a first direction d1 and a second direction d2 perpendicular to each other. The first lamp plate and the second lamp plate in each group of lamp plates arranged in the first direction d1 approach each other by mutual attraction, and the first lamp plate and the second lamp plate in each group of lamp plates arranged in the second direction d2 can approach each other by mutual attraction or not by mutual attraction. For example, the second lamp plate 122 and the fourth lamp plate 124 may not approach each other by mutual attraction, and the first lamp plate 121 and the third lamp plate 123 may approach each other by mutual attraction. Alternatively, in other embodiments, the first lamp plate and the second lamp plate of a group of lamp plates arranged in the second direction d2 may all or all not attract each other.

Specifically, the first direction d1 is perpendicular to the second direction d2, and the first direction d1 and the second direction d2 may be the length direction and the width direction of the lamp plate, respectively. According to the above embodiment, the first lamp plate and the second lamp plate in a group of lamp plates arranged in the longitudinal direction attract each other and approach each other, while the first lamp plate and the second lamp plate in a group of lamp plates arranged in the width direction do not attract each other and approach each other.

Figure 6:
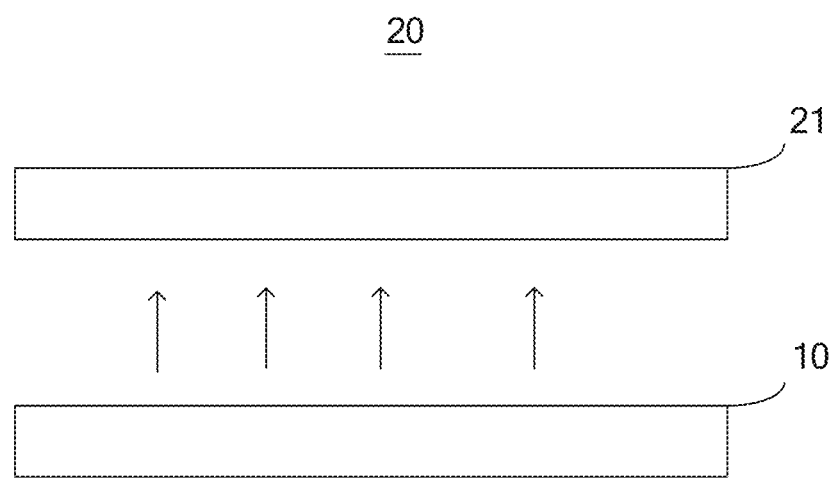
FIG. 6 is a structural diagram of a display device provided by a third embodiment of the present application.

Specifically, the polarities of the opposite poles in the adjacent magnetic attraction parts 13 of the first lamp plate and the second lamp plate in a group of lamp plates provided in the second direction d2 are the same or opposite. As shown in FIG. 6, the N pole of the magnetic attraction part 13 in the second lamp plate 122 is disposed opposite to the N pole of the magnetic attraction part 13 in the fourth lamp plate 124, and the S pole of the magnetic attraction part 13 in the second lamp plate 122 is disposed opposite to the S pole of the magnetic attraction part 13 in the fourth lamp plate 124. At this time, the second lamp plate 122 and the fourth lamp plate 124 do approach each other by mutual attraction. The N pole of the magnetic attraction part 13 in the first lamp plate 121 and the S pole of the magnetic attraction part 13 in the third lamp plate 123 are disposed opposite each other to achieve mutual attraction.

FIG. 5 only shows two columns of one lamp plate arranged in the first direction d1 and two rows of the lamp plate arranged in the second direction d2. In other embodiments, three or more rows of the lamp plate may be arranged in the first direction d1 and more than two rows of lamp plate may be arranged in the second direction d2. In this embodiment, adjacent lamp plates arranged in the first direction d1 can attract each other to approach each other, and adjacent lamp plates arranged in the second direction d2 can partially or completely attract each other.

Further referring to FIGS. 4 and 5, in some embodiments, the magnetic attraction part 13 is detachably disposed in an edge area of the lamp plate. Specifically, the edge area of the lamp plate is a peripheral area of the lamp plate, and the peripheral area of the lamp plate is an area formed by extending the periphery of the lamp plate inward for a certain distance.

Specifically, one side of the lamp plate may be provided with a metal part or a magnetism section, and the magnetic attraction part 13 is fixed to the metal part by attracting the metal part, or the magnetic attraction part 13 is fixed to the magnetism section by mutual attraction with the magnetic part. In some more specific embodiments, when a magnetic part is provided on one side of the lamp plate, a metal or metal mixture may be plated on one side of the lamp plate to form the magnetism section. For example, one side of the lamp plate can be plated with iron, cobalt, nickel or a mixture of these three metals to form the magnetism section.

When the magnetic attraction part 13 is arranged at the peripheral area of the lamp plate, a relatively good magnetic attraction effect between adjacent lamp plates can be achieved, thereby achieving a relatively good effect of reducing the joint between the lamp plates. Alternatively, in order to achieve a better fixing effect on the lamp plate, a magnetic attraction part can be provided at the center of the lamp plate, thus achieving a more comprehensive fixing effect on the lamp plate.

Further, grounding areas are provided at four corners of the edge area of the lamp plate, and one magnetic attraction part 13 is provided corresponding to each grounding area. The grounding area is arranged at the four corners of the edge area, that is, the area where the four corners of the lamp plate are arranged. The grounding area is an area where the components on the lamp plate achieve the grounding function, and the magnetic attraction part 13 is arranged at the position of the original grounding area to facilitate the arrangement of the metal layer or the magnetic attraction layer. In other embodiments, the magnetic attraction part 13 may also be directly fixed to the grounding area by its magnetic attraction effect.

Further, a magnetic attraction layer can be provided in a corresponding region of the back plate 11, so that the magnetic attraction part 13 is fixed to the back plate by mutual attraction between the magnetic attraction part 13 and the magnetic attraction layer of the back plate. In some specific embodiments, when the magnetic attraction layer is provided on the back plate 11, the magnetic attraction layer may be provided as a NdFeB magnet, a samarium cobalt magnet or an aluminum nickel cobalt magnet.

Further, referring to FIG. 1, one side of the back plate 11 is provided with a groove 111 with an opening facing the lamp plate, and the magnetic attraction part 13 is arranged in the groove 111 through a clearance fit, and a part of the magnetic attraction part 13 extends out of the groove 111 to be fixed with the lamp plate.

In this embodiment, the magnetic attraction part 13 is movable in the groove 111. On the one hand, when the magnetic attraction parts 13 of adjacent lamp plates are attracted to each other, the magnetic attraction part 13 can be moved in the groove 111, so that the lamp plates can be moved to reduce the interval between the lamp plates. On the other hand, when the lamp plate is expanded by heat, the magnetic attraction part 13 of the adjacent lamp plates that are magnetically fixed to the back plate can move in the groove 111, causing the lamp plate to move, thereby preventing the lamp plate from being extruded and deformed.

The magnetic attraction part 13 is fixed in a sliding manner in the depth direction of the groove 111 so that the lamp plate is fixed in a direction perpendicular to the back plate 11. In some specific embodiments, the metal part or the magnetic part may be provided at the bottom of the groove 111 so that the lamp plate is fixed in a direction perpendicular to the back plate 11.

Third Embodiment

Another aspect of the present application provides a display device 20. Please refer to FIG. 6, which is a structural diagram of the display device 20 provided by the third embodiment of the present application.

Specifically, the display device 20 may include a backlight module which may be the backlight module 10 described in any of the above embodiments, and a display panel 21. The backlight module 10 is disposed on the non-display side of the display panel 21, and is further used for providing a backlight for the display panel 21 through the backlight module 10, allowing the display panel 21 to display.

The above are only embodiments of the present application and are not intended to limit the scope of the present application. Any equivalent structure or equivalent process transformation made by using the description of the present application and the accompanying drawings, or directly or indirectly applied to other related technical fields, shall also be included in the patent protection scope of the present application.

What is claimed is:

1. A backlight module comprising:
a back plate;
at least two lamp plates disposed on a side of the back plate;
a diffuser plate disposed on a side of the at least two lamp plates away from the back plate;
a plurality of layers of optical film disposed on a side of the diffuser plate away from the at least two lamp plates; and
at least two magnetic attraction parts disposed on a back side of the at least two lamp plates, the at least two magnetic attraction parts being attracted to a lamp-plate mounting side of the back plate;
wherein the back plate, at the at least two lamp plates, the diffuser plate and the plurality of layers of optical film are arranged in a form of stack;
wherein two adjacent lamp plates are provided in one group, and wherein for at least one group, a magnetic attraction part of a first lamp plate has a first pole, a magnetic attraction part of a second lamp plate has a second pole with a polarity opposite to a polarity of the first pole, and the first lamp plate and the second lamp plate are attracted by the first pole and the second pole;
wherein four corners of an edge area of the at least two lamp plates are provided with grounding areas, each of the grounding areas being correspondingly provided with one of the least two magnetic attraction parts.

2. The backlight module according to claim 1, wherein for the group, the first lamp plate and the second lamp plate are provided with reflective paste at an interval position.

3. The backlight module according to claim 1, wherein each of the at least two magnetic attraction parts has the first pole and the second pole, and wherein for the group, the first pole of the magnetic attraction part on the first lamp plate and the second pole of the magnetic attraction part on the second lamp plate are arranged adjacent to each other in an arrangement direction of the first lamp plate and the second lamp plate.

4. The backlight module according to claim 3, wherein the first pole and the second pole of the magnetic attraction part are arranged in a direction parallel to a plane of the at least two lamp plates, and wherein in the group, an arrangement direction of the first pole and the second pole on the first lamp plate intersects an arrangement direction of the first pole and the second pole on the second lamp plate.

5. The backlight module according to claim 4, wherein each of the at least two lamp plates is provided with four magnetic attraction parts arranged in an array in a row direction and a column direction, wherein for each of the at least two lamp plates, the arrangement direction of the first pole and the second pole of one of the two magnetic attraction parts in the row direction intersects with the arrangement direction of the first pole and the second pole of the other one of the two magnetic attraction parts, and polarities of adjacent poles of the two magnetic attraction parts are the same, and wherein like poles of the two magnetic attraction parts in the column direction are opposite to each other in the column direction.

6. The backlight module according to claim 1, wherein a plurality of lamp plates are provided and arranged in arrays in a row direction and a column direction, two adjacent lamp plates in the row direction forming the group;

wherein like poles of the magnetic attraction parts of the two adjacent lamp plates in the column direction are opposite to each other in the column direction; or opposite poles of the magnetic attraction parts of the two adjacent lamp plates in the column direction are opposite to each other in the column direction.

7. The backlight module according to claim 1, wherein one side of the back plate is provided with a groove with an opening facing the at least two lamp plates, the least two magnetic attraction parts are disposed in the groove through a clearance fit, and a part of the least two magnetic attraction parts extends out of the groove.

8. A display device comprising:
a backlight module comprising:
a back plate;
at least two lamp plates disposed on a side of the back plate;
a diffuser plate disposed on a side of the at least two lamp plates away from the back plate;
a plurality of layers of optical film disposed on a side of the diffuser plate away from the at least two lamp plates; and
at least two magnetic attraction parts disposed on a back side of the at least two lamp plates, the at least two magnetic attraction parts being attracted to a lamp-plate mounting side of the back plate;
wherein the back plate, the at least two lamp plates, the diffuser plate and the plurality of layers of optical film are arranged in a form of stack; and
a display panel, wherein the backlight module is configured for providing a backlight for the display panel;
two adjacent lamp plates are provided in one group, and wherein for at least one group, a magnetic attraction part of a first lamp plate has a first pole, a magnetic attraction part of a second lamp plate has a second pole with a polarity opposite to a polarity of the first pole, and the first lamp plate and the second lamp plate are attracted by the first pole and the second pole;
wherein four corners of an edge area of the at least two lamp plates are provided with grounding areas, each of the grounding areas being correspondingly provided with one of the at least two magnetic attraction parts.

9. The display device according to claim 8, wherein for the group, the first lamp plate and the second lamp plate are provided with reflective paste at an interval position.

10. The display device according to claim 8, wherein each of the at least two magnetic attraction parts has the first pole and the second pole, and wherein for the group, the first pole of the magnetic attraction part on the first lamp plate and the second pole of the magnetic attraction part on the second lamp plate are arranged adjacent to each other in an arrangement direction of the first lamp plate and the second lamp plate.

11. The display device according to claim 10, wherein the first pole and the second pole of the at least two magnetic attraction parts are arranged in a direction parallel to a plane of the at least two lamp plates, and wherein for the group, an arrangement direction of the first pole and the second pole on the first lamp plate intersects an arrangement direction of the first pole and the second pole on the second lamp plate.

12. The display device according to claim 11, wherein each of the at least two lamp plates is provided with four magnetic attraction parts arranged in an array in a row direction and a column direction, wherein for each of the at least two lamp plates, the arrangement direction of the first pole of one of the two magnetic attraction parts in the row direction intersects with the arrangement direction of the second pole of the other one of the two magnetic attraction parts, and polarities of adjacent poles of the two magnetic attraction parts are the same, and wherein like poles of the two magnetic attraction parts in the column direction are opposite to each other in the column direction.

13. The display device according to claim 8, wherein a plurality of lamp plates are provided and arranged in arrays in a row direction and a column direction, two adjacent lamp plates in the row direction forming the group;

wherein like poles of the magnetic attraction parts of the two adjacent lamp plates in the column direction are opposite to each other in the column direction; or opposite poles of the magnetic attraction parts of the two adjacent lamp plates in the column direction are opposite to each other in the column direction.

14. The display device according to claim 8, wherein one side of the back plate is provided with a groove with an opening facing the at least two lamp plates, the at least two magnetic attraction parts are disposed in the groove through a clearance fit, and a part of the at least two magnetic attraction parts extends out of the groove.

15. The display device according to claim 8, wherein each of the at least two lamp plates is provided with four magnetic attraction parts arranged in an array in a row direction and a column direction, wherein for each of the lamp plates, the arrangement direction of the first pole and the second pole of one of the two magnetic attraction parts in the row direction intersects with the arrangement direction of the first pole and the second pole of the other one of the two magnetic attraction parts, and polarities of adjacent poles of the two magnetic attraction parts are the same, and the arrangement direction of the first pole and the second pole of one of the two magnetic attraction parts in the column direction is parallel to the arrangement direction of the first pole and the second pole of the other one of the two magnetic attraction parts, and polarities of adjacent poles of the two magnetic attraction parts in the column direction are different.

* * * * *